(12) United States Patent
Kuroda et al.

(10) Patent No.: US 9,796,035 B2
(45) Date of Patent: Oct. 24, 2017

(54) SCREEN PRINTING MACHINE, ELECTRONIC COMPONENT MOUNTING SYSTEM, AND SCREEN PRINTING METHOD

(71) Applicant: PANASONIC INTELLECTUAL PROPERTY MANAGEMENT CO., LTD., Osaka (JP)

(72) Inventors: Seiya Kuroda, Yamanashi (JP); Tetsuya Tanaka, Yamanashi (JP); Michinori Tomomatsu, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/539,314

(22) Filed: Nov. 12, 2014

(65) Prior Publication Data

US 2015/0129641 A1    May 14, 2015

(30) Foreign Application Priority Data

Nov. 14, 2013 (JP) .................................. 2013-235671

(51) Int. Cl.
  *B23K 31/02* (2006.01)
  *B23K 3/06* (2006.01)
  (Continued)

(52) U.S. Cl.
  CPC .......... *B23K 3/0638* (2013.01); *B23K 1/0016* (2013.01); *B41F 15/44* (2013.01);
  (Continued)

(58) Field of Classification Search
  None
  See application file for complete search history.

(56) References Cited

U.S. PATENT DOCUMENTS 4,589,336 A * 5/1986 Klemm ......................... 101/124
5,201,452 A * 4/1993 Takahashi et al. ............... 228/8
(Continued)

FOREIGN PATENT DOCUMENTS

EP         0848586 A1 *  6/1998   ............. B41F 15/42
JP        59185651 A  * 10/1984   ............. B41F 15/42
(Continued)

*Primary Examiner* — Kiley Stoner
(74) *Attorney, Agent, or Firm* — Pearne & Gordon LLP

(57) ABSTRACT

A screen printing machine for forming a print of paste supplied to a mask plate having pattern holes, includes: a flexible filling squeegee which performs a squeegeeing operation in which the filling squeegee is moved relative to the mask plate in a printing direction; and a scraping squeegee which is held to maintain a given interval from the filling squeegee in the printing direction and to be movable together with the filling squeegee in the printing direction, and which scraps off the paste remaining on the mask plate after passage of the filling squeegee. In the squeegeeing operation, the filling squeegee is pushed up and bent by the paste to provide a clearance between a bottom end of the filling squeegee and the mask plate with the paste interposed therebetween so that the pattern holes are filled with paste with a prescribed filling pressure.

7 Claims, 11 Drawing Sheets

(51) Int. Cl.
  *B41F 15/44*  (2006.01)
  *H05K 13/04*  (2006.01)
  *B23K 1/00*   (2006.01)
  *H05K 3/12*   (2006.01)
  *H05K 3/34*   (2006.01)

(52) U.S. Cl.
  CPC ....... H05K 3/1233 (2013.01); H05K 13/0465 (2013.01); *H05K 3/3484* (2013.01); *H05K 2203/0139* (2013.01)

(56) References Cited

U.S. PATENT DOCUMENTS

| | | | |
|---|---|---|---|
| 5,476,039 A * | 12/1995 | Hiruta et al. | 101/123 |
| 5,479,854 A * | 1/1996 | Chikahisa et al. | 101/123 |
| 5,643,831 A * | 7/1997 | Ochiai et al. | 438/616 |
| 5,649,479 A * | 7/1997 | Hoffman | 101/123 |
| 5,694,843 A * | 12/1997 | Chen | 101/123 |
| 5,775,219 A * | 7/1998 | Shimazu | B41F 15/42 101/123 |
| 6,092,463 A * | 7/2000 | Onishi | B41F 15/40 101/123 |
| 6,237,490 B1 * | 5/2001 | Takahashi | B41F 15/0818 101/123 |
| 6,494,132 B1 * | 12/2002 | Sano et al. | 101/123 |
| 6,776,090 B2 * | 8/2004 | Takenaka et al. | 101/127 |
| 6,789,720 B2 * | 9/2004 | Uchida et al. | 228/22 |
| 7,171,897 B2 * | 2/2007 | Barajas | H05K 3/1233 101/123 |
| 8,152,049 B2 * | 4/2012 | Morita et al. | 228/249 |
| 8,342,381 B2 * | 1/2013 | Sumioka | 228/102 |
| 8,640,615 B2 * | 2/2014 | Miyahara et al. | 101/123 |
| 8,800,441 B2 * | 8/2014 | Clarke | 101/123 |
| 2001/0008101 A1 * | 7/2001 | Ooe | 101/123 |
| 2001/0032556 A1 * | 10/2001 | Ishida et al. | 101/129 |
| 2001/0038882 A1 * | 11/2001 | Onishi et al. | 427/96 |
| 2002/0108513 A1 | 8/2002 | Onishi et al. | |
| 2002/0170945 A1 * | 11/2002 | Shafie | 228/223 |
| 2004/0035306 A1 * | 2/2004 | Onishi et al. | 101/123 |
| 2004/0237813 A1 * | 12/2004 | Maeda et al. | 101/123 |
| 2005/0034780 A1 * | 2/2005 | Sakaida | H05K 3/4053 141/125 |
| 2006/0237516 A1 * | 10/2006 | Leon | 228/180.22 |
| 2007/0232055 A1 * | 10/2007 | Corley | H01L 21/56 438/618 |
| 2007/0262118 A1 * | 11/2007 | Morita et al. | 228/101 |
| 2007/0272100 A1 * | 11/2007 | Chen | 101/123 |
| 2008/0121124 A1 * | 5/2008 | Sato | 101/123 |
| 2008/0289518 A1 * | 11/2008 | Inoue et al. | 101/123 |
| 2009/0158943 A1 * | 6/2009 | Kobayashi | 101/123 |
| 2010/0000428 A1 * | 1/2010 | Chen | 101/123 |
| 2011/0017080 A1 * | 1/2011 | Miyahara et al. | 101/123 |
| 2011/0132212 A1 * | 6/2011 | Kondo et al. | 101/123 |
| 2011/0162202 A1 * | 7/2011 | Miyahara et al. | 29/832 |
| 2011/0219966 A1 * | 9/2011 | Willshere | 101/123 |
| 2012/0085252 A1 | 4/2012 | Miyahara et al. | |
| 2012/0090484 A1 | 4/2012 | Miyahara et al. | |
| 2013/0239829 A1 * | 9/2013 | Kobayashi et al. | 101/123 |
| 2013/0239830 A1 * | 9/2013 | Tomomatsu et al. | 101/123 |
| 2014/0020579 A1 * | 1/2014 | Sumioka et al. | 101/123 |
| 2014/0073088 A1 * | 3/2014 | Maeda et al. | 438/107 |
| 2014/0102322 A1 * | 4/2014 | Tomomatsu et al. | 101/123 |
| 2014/0130940 A1 * | 5/2014 | Okada | 148/24 |
| 2014/0182464 A1 * | 7/2014 | Zhang | 101/123 |
| 2014/0208587 A1 * | 7/2014 | Maeda et al. | 29/832 |
| 2014/0231492 A1 * | 8/2014 | Saeki et al. | 228/180.22 |
| 2014/0318393 A1 * | 10/2014 | Kobayashi et al. | 101/123 |
| 2014/0318394 A1 * | 10/2014 | Tomomatsu et al. | 101/123 |
| 2014/0366754 A1 * | 12/2014 | Kobayashi et al. | 101/123 |
| 2015/0075721 A1 * | 3/2015 | Mantani et al. | 156/387 |
| 2015/0090134 A1 * | 4/2015 | Li et al. | 101/123 |
| 2015/0090770 A1 * | 4/2015 | Mantani et al. | 228/102 |
| 2015/0129640 A1 * | 5/2015 | Kuroda et al. | 228/41 |
| 2016/0067954 A1 * | 3/2016 | Fukakusa | B41F 15/0881 101/127.1 |

FOREIGN PATENT DOCUMENTS

| | | | | |
|---|---|---|---|---|
| JP | 02022889 A | * | 1/1990 | ............. H05K 3/34 |
| JP | 04146147 A | * | 5/1992 | |
| JP | 09076451 A | * | 3/1997 | |
| JP | 09156074 A | * | 6/1997 | |
| JP | 11-042763 A | | 2/1999 | |
| JP | 11216840 A | * | 8/1999 | |
| JP | 2004001554 A | * | 1/2004 | |
| JP | 2005199545 A | * | 7/2005 | |
| JP | 2008000925 A | * | 1/2008 | |
| JP | 2009-252808 A | | 10/2009 | |
| JP | WO 2010097904 A1 | * | 9/2010 | ............. H03H 3/04 |
| JP | 2011189673 A | * | 9/2011 | |
| JP | 2013076684 A | * | 4/2013 | |
| JP | 2013-169747 A | | 9/2013 | |
| JP | 5359947 B2 | * | 12/2013 | |
| WO | WO 2012173059 A1 | * | 12/2012 | |

* cited by examiner

SCREEN PRINTING MACHINE, ELECTRONIC COMPONENT MOUNTING SYSTEM, AND SCREEN PRINTING METHOD

BACKGROUND

1. Technical Field

An aspect of the present invention relates to a screen printing machine for forming a print of paste such as cream solder on a board. Another aspect of the present invention relates to an electronic component mounting system including the screen printing machine. Yet another aspect of the invention relates to a screen printing method.

2. Description of Related Art

Screen printing is known as a method for forming a print of paste such as cream solder or conductive paste on a board in an electronic component mounting process. In this method, a paste print is formed on a board through pattern holes that are formed so as to conform to print subject portions. A paste print is formed on a board that is set on the bottom surface of a mask plate by filling the pattern holes with paste by a squeegeeing operation of moving a spatula-shaped squeegee member in a horizontal direction with its bottom end pressed against the mask plate.

In recent years, with the demand of productivity increase and increased difficulty of printing due to reduction of the pitches of printing portions on boards, it has become an important issue to supply sufficient amounts of paste to printing portions even in the case of a high-speed squeegeeing operation. One means for satisfying this requirement is a method that uses two kinds of squeegee members, that is, a filling squeegee and a scraping squeegee (refer to JP-A-H11-042763, for example). In the method disclosed in JP-A-H11-042763, two scraping squeegees are provided, which are elevated or lowered being driven via drive shafts of a vertical driving device. Further, a filling squeegee which is also elevated or lowered being driven via a drive shaft of the vertical driving device is provided between the two scraping squeegees. The filling surface of the filling squeegee is formed so as to be inclined with respect to a mask plate by a prescribed angle.

In a squeegeeing operation of the screen printing machine disclosed in JP-A-H11-042763, the filling squeegee is moved over the mask plate in a state that a prescribed clearance is set between the bottom end of the filling squeegee and the mask plate. This makes it possible to supply sufficient amounts of paste to printing portions on a board by increasing the filling pressure at the time of filling the pattern holes with paste by means of the filling surface of the filling squeegee. Paste remaining on the mask plate after passage of the filling squeegee is scraped off by the scraping squeegees.

SUMMARY

However, in the above-described technique, the angle formed by the top surface of the mask plate and the filling surface of the filling squeegee is always kept constant, and the clearance is not controlled during printing. As a result, the filling pressure may decrease gradually as the amount of paste caught by the filling squeegee decreases during printing. This may cause unevenness occurring in the amount of paste supplied to a board from immediately after a start of a screen printing operation to an end thereof, which may result in lowering of the print quality.

An object of aspects of the present invention is to provide a screen printing machine, an electronic component mounting system, and a screen printing method which can prevent unevenness of a paste print formed on a board, thereby preventing lowering of the print quality.

According to an aspect of the present invention, there is provided a screen printing machine for forming, on a board, a print of paste supplied to a mask plate having pattern holes in a state where the board contacts the mask plate, the screen printing machine including: a filling squeegee which fills the pattern holes with the paste by performing a squeegeeing operation in which the filling squeegee is moved relative to the mask plate in a printing direction; and a scraping squeegee which is held to maintain a given interval from the filling squeegee in the printing direction and to be movable together with the filling squeegee in the printing direction, and which scraps off the paste remaining on the mask plate after passage of the filling squeegee, wherein the filling squeegee is flexible, and wherein in the squeegeeing operation, the filling squeegee is pushed up and bent by the paste so as to provide a given clearance between a bottom end of the filling squeegee and the mask plate with the paste interposed therebetween so that the pattern holes are filled with paste with a given filling pressure.

According to another aspect of the present invention, there is provided an electronic component mounting system including: the screen printing machine; and an electronic component mounting machine which mounts an electronic component on the board on which the print of paste has been formed by the screen printing machine.

According to yet another aspect of the present invention, there is provided a screen printing method for forming, on a board, a print of paste supplied to a mask plate having pattern holes using a screen printing machine which includes: a filling squeegee which is flexible; and a scraping squeegee which is held to maintain a given interval from the filling squeegee in the printing direction and to be movable together with the filling squeegee in the printing direction, and which scraps off the paste remaining on the mask plate after passage of the filling squeegee, the screen printing method including: setting the mask plate and the board to contact each other; and performing a squeegeeing operation in which the filling squeegee is moved relative to the mask plate in a printing direction to fill the pattern holes with the paste, wherein in the squeegeeing operation, the filling squeegee is pushed up and bent by the paste so as to provide a given clearance between a bottom end of the filling squeegee and the mask plate with the paste interposed therebetween so that the pattern holes are filled with paste with a given filling pressure.

According to aspects of the present invention, it is possible to prevent unevenness of a paste print formed on a board, thereby preventing lowering of the print quality.

DETAILED DESCRIPTION

Figure 1:
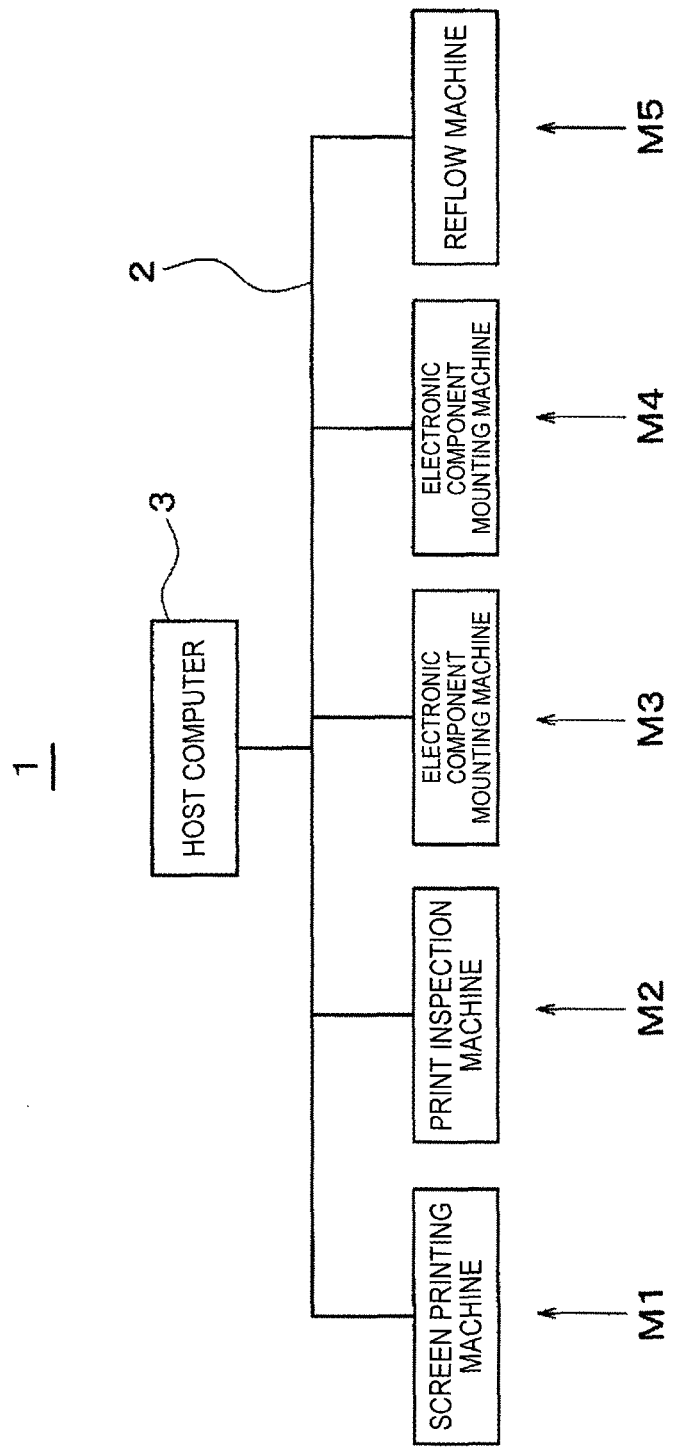
FIG. 1 shows the overall configuration of an electronic component mounting system according to an embodiment of the present invention.

First, the overall configuration of an electronic component mounting system will be described with reference to FIG. 1. The electronic component mounting system 1 has a function of mounting an electronic component on a board via paste such as cream solder. Plural component mounting machines including a screen printing machine M1, a print inspection machine M2, electronic component mounting machines M3 and M4, and a reflow machine M5 are connected together in cascade and connected to each other by a communication network 2 so as to be controlled as a whole by a host computer 3.

The screen printing machine M1 screen-prints paste layers on electronic component joining electrodes formed on a board. The print inspection machine M2 performs print inspection including judgment as to whether or not the paste layers formed on the board are in good print states and detection of deviations of printed paste layers from electrodes. The electronic component mounting machines M3 and M4 mount electronic components on the board on which the paste layers have been formed by the screen printing machine M1. The reflow machine M5 joins the electronic components to the board by melting the solder by heating the electronic-components-mounted board according to a prescribed temperature profile.

Figure 2:
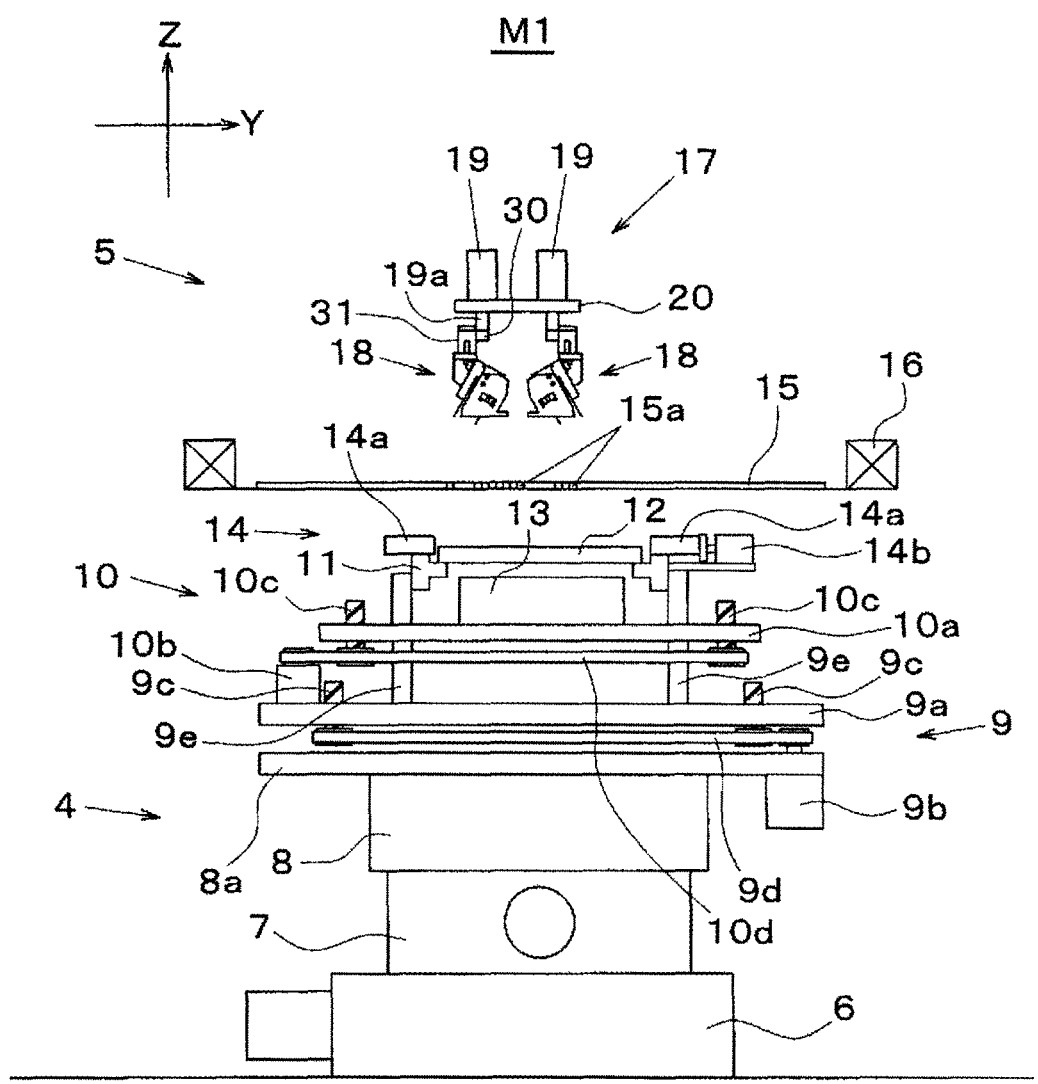
FIG. 2 is a front view of a screen printing machine according to the embodiment of the invention.

Next, the overall configuration of the screen printing machine M1 will be described with reference to FIG. 2 to FIGS. 4A and 4B. As shown in FIG. 2, in the screen printing machine M1, a screen printing mechanism 5 is disposed over a board positioning unit 4. In the board positioning unit 4, a Y-axis table 6, an X-axis table 7, and a θ-axis table 8 are stacked one on another and a combination of a first Z-axis table 9 and a second Z-axis table 10 is disposed on them.

The structure of the first Z-axis table 9 will be described below. A horizontal base plate 9a is held by an elevation guide mechanism (not shown) in an elevatable manner on the side of the top surface of a horizontal base plate 8a which is disposed on the top surface of the θ-axis table 8. The base plate 9a is elevated and lowered by a Z-axis elevation mechanism which rotationally drives plural feed screws 9c with a motor 9b via a belt 9d.

Figure 3:
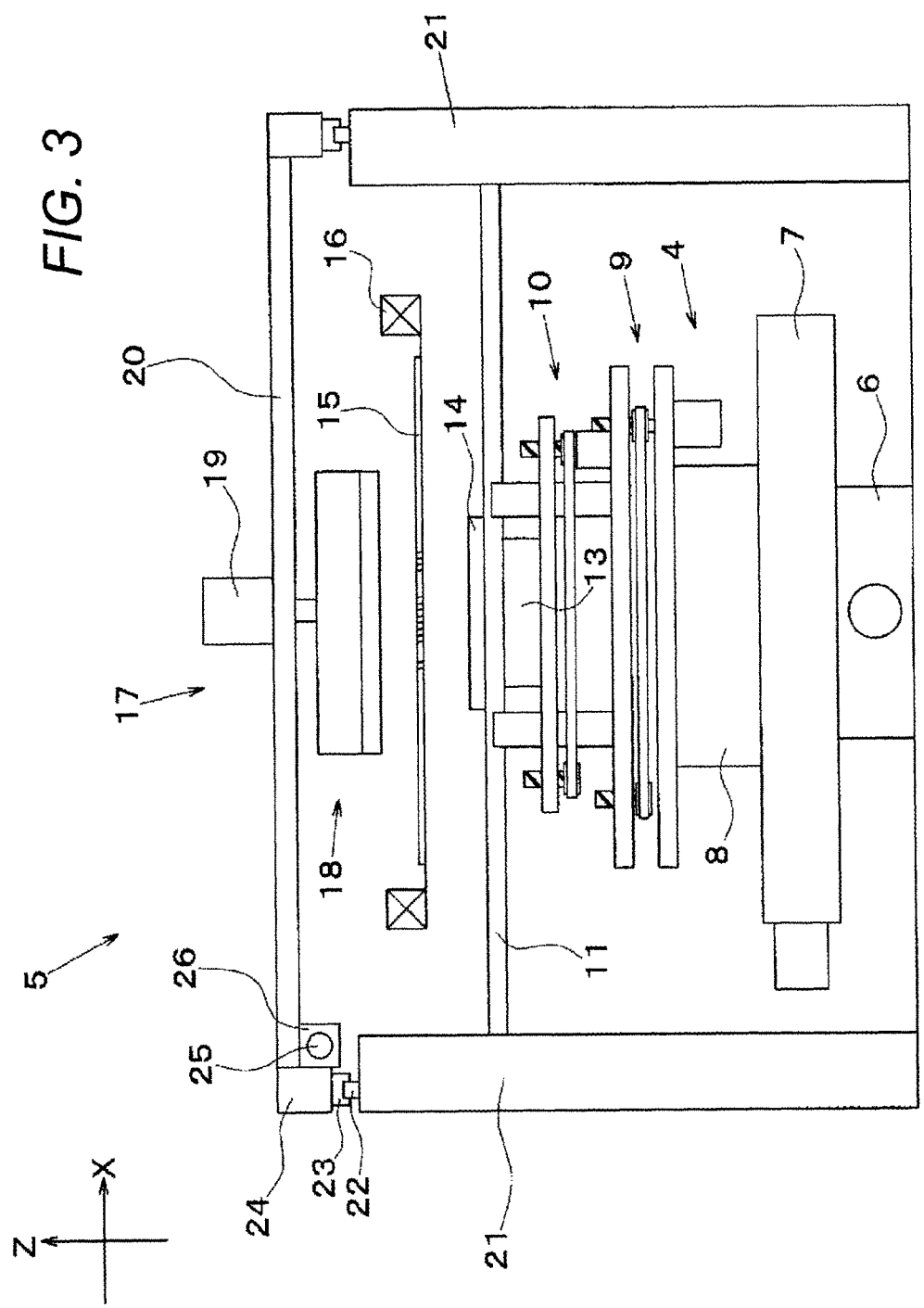
FIG. 3 is a side view of the screen printing machine according to the embodiment of the invention.
Figure 4A:
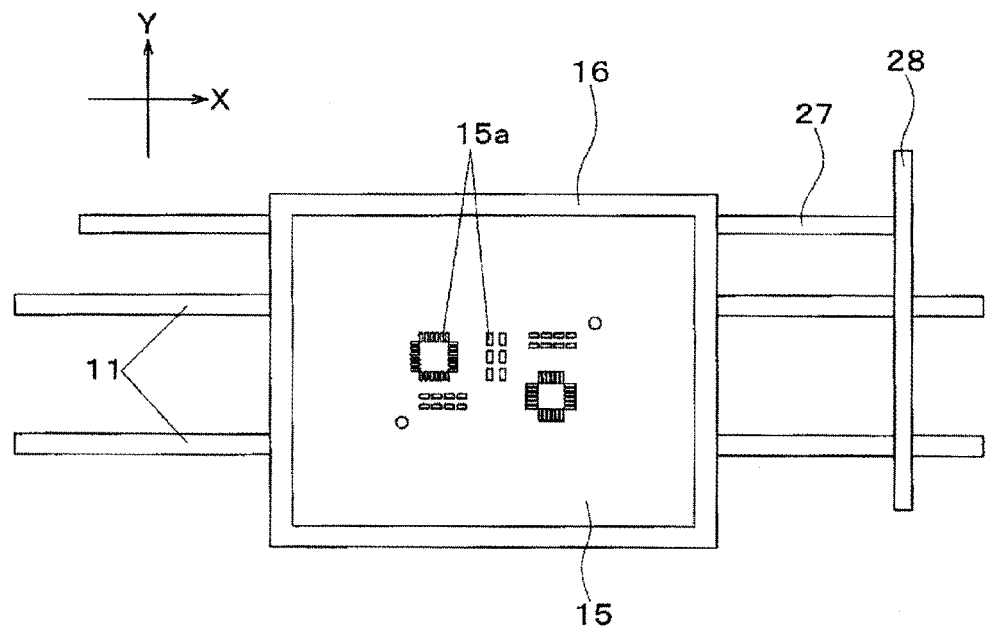
FIGS. 4A and 4B are plan views of parts of the screen printing machine according to the embodiment of the invention.
Figure 4B:
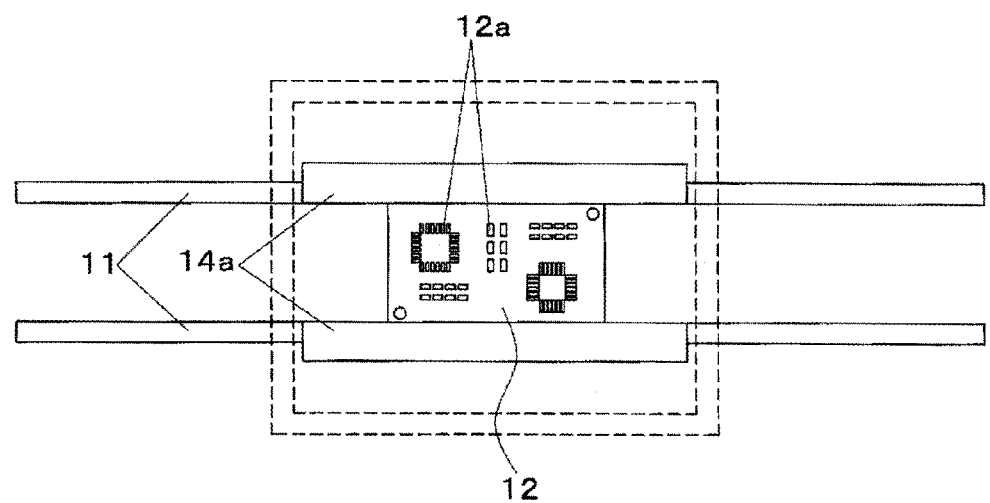

Vertical frames 9e are erected from the base plate 9a and a board conveying mechanism 11 is held by top end portions of the vertical frames 9e. The board conveying mechanism 11 is equipped with two conveyance rails which are disposed parallel with a board conveying direction (in the X direction which is perpendicular to the paper surface of FIG. 1), and a board 12 is conveyed with its two end portions supported by the respective conveyance rails. By driving the first Z-axis table 9, the board 12 being held by the board conveying mechanism 11 can be elevated or lowered with respect to the screen printing mechanism 5 together with the board conveying mechanism 11. As shown in FIG. 3 and FIGS. 4A and 4B, the board conveying mechanism 11 extends to the upstream side (left side in FIG. 3 and FIGS. 4A and 4B) and to the downstream side. The board 12 which has been carried in from the upstream side is conveyed by the board conveying mechanism 11 and then positioned by the board positioning unit 4. After being subjected to printing by the screen printing mechanism 5, the board 12 is carried out to the downstream side by the board conveying mechanism 11.

Next, the structure of the second Z-axis table 10 will be described. A horizontal base plate 10a is disposed between the board conveying mechanism 11 and the base plate 9a so as to be elevatable along an elevation guide mechanism (not shown). The base plate 10a is elevated and lowered by a Z-axis elevation mechanism which rotationally drives plural feed screws 10c with a motor 10b via a belt 10d. A board receiving member 13 whose top surface is a receiving surface for holding the substrate 12 is disposed on the top surface of the base plate 10a.

By driving the second Z-axis table 10, the board receiving member 13 can be elevated or lowered with respect to the board 12 being held by the board conveying mechanism 11. The receiving surface of the board receiving member 13 comes into contact with the bottom surface of the board 12 and thereby supports the board 12 from below. A clamp mechanism 14 is disposed on the top surfaces of the board conveying mechanism 11. The clamp mechanism 14 is equipped with two clamp members 14a which are opposed to each other in the left-right direction. The board 12 is fixed being pressed from both sides by advancing one clamp member 14a by means of the drive mechanism 14a.

Next, a description will be made of the screen printing mechanism 5 which is disposed over the board positioning unit 4. As shown in FIGS. 2 and 3, the screen printing mechanism 5 is equipped with a mask plate 15 which is stretched within a mask frame 16. Pattern holes 15a are formed through the mask plate 15 in such shapes and at such positions as to correspond to print target electrodes 12a of the board 12 (see FIGS. 4A and 4B). A squeegee head 17, which is disposed over the mask plate 15, has a structure that two squeegee elevation mechanisms 19 for elevating and lowering respective squeegee units 18 are disposed on a horizontal plate 20.

As shown in FIG. 2, the two squeegee elevation mechanisms 19 which are disposed on the top surface of the horizontal plate 20 have respective elevation shafts 19a which extend downward. And block-shaped attachment members 30 are connected to bottom end portions of the elevation shafts 19a, respectively. The squeegee units 18 are attached to the attachment members 30 via brackets 31, respectively. Details of the squeegee units 18 will be described later.

As shown in FIG. 3, guide rails 22 are disposed on respective vertical frames 21 so as to extend in the Y direction. And sliders 23 which are fitted with the respective guide rails 22 slidably are connected to the two ends of the plate 20 via blocks 24, respectively. With this structure, the squeegee head 17 can slide in the Y direction. The plate 20 is moved horizontally in the Y direction by a squeegee head moving means which consists of a nut 26, a feed screw 25, and a squeegees moving motor (not shown) which rotationally drives the feed screw 25.

As shown in FIGS. 4A and 4B, a head X-axis moving mechanism 27 and a head Y-axis moving mechanism 28 are disposed on the side of the bottom surface of the mask plate 15 and a camera unit and a cleaning unit (neither of which are shown) are attached to the head X-axis moving mechanism 27. The camera unit is equipped with a mask recognition camera for shooting the bottom surface of the mask plate 15 and a board recognition camera for shooting the board 12, and is moved horizontally by the head X-axis moving mechanism 27 and the head Y-axis moving mechanism 28. Likewise, the cleaning unit is moved horizontally by the head X-axis moving mechanism 27 and the head Y-axis moving mechanism 28 and thereby cleans the bottom surface of the mask plate 15 by means of cleaning paper.

Next, the structure of one of the squeegee units 18 of the squeegee head 17 will be described with reference to FIGS. 5A and 5B and FIGS. 6A and 6B. The one squeegee unit 18 is composed of a first squeegee unit 32 having a scraping squeegee 33 and a second squeegee unit 42 having a filling squeegee 43. The second squeegee unit 42 can be attached to and detached from the first squeegee unit 32 because of a structure described below. The scraping squeegee 33 and the filling squeegee 43 are moved together in a printing direction by the squeegee head moving means. The scraping squeegee 33 and the filling squeegee 43 are elevated or lowered relative to the mask plate 15 by driving the corresponding squeegee elevation mechanism 19, which is an elevating/lowering means for elevating and lowering the scraping squeegee 33 and the filling squeegee 43.

The first squeegee unit 32 has a first member 34 and a second member 35 which are inclined (overhang) in an advancement direction (printing direction; indicated by arrow "a" in FIG. 5A) in which the scraping squeegee 33 is moved on the mask plate 15 during a squeegeeing operation. The first member 34 and the second member 35 are rectangular members which extend in the X direction which is perpendicular to the squeegeeing direction (i.e., the advancement direction of the scraping squeegee 33). The first member 34 is located downstream of the second member 35 in the advancement direction of the scraping squeegee 33. The brackets 31 are connected to the second member 35 via respective link members 36, which are fastened to the brackets 31 with bolts 37.

Figure 5A:
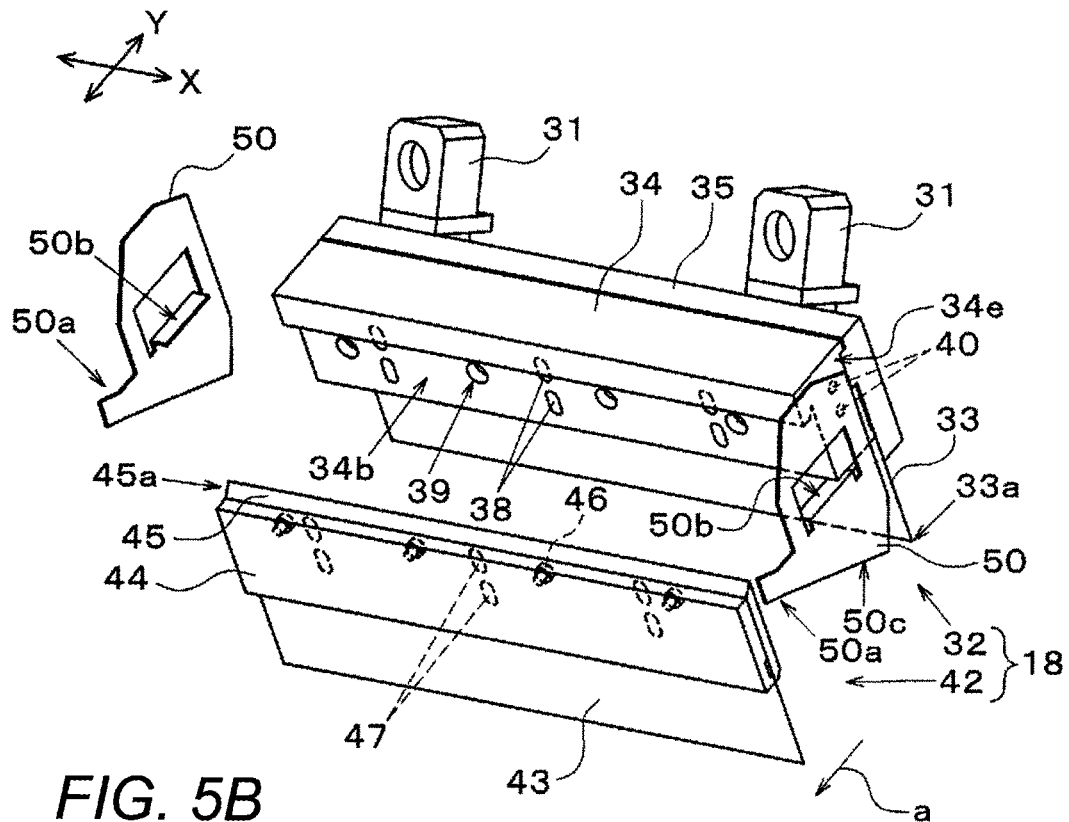
FIG. 5A is an exploded perspective view of one squeegee unit provided in the screen printing machine according to the embodiment of the invention.
Figure 6A:
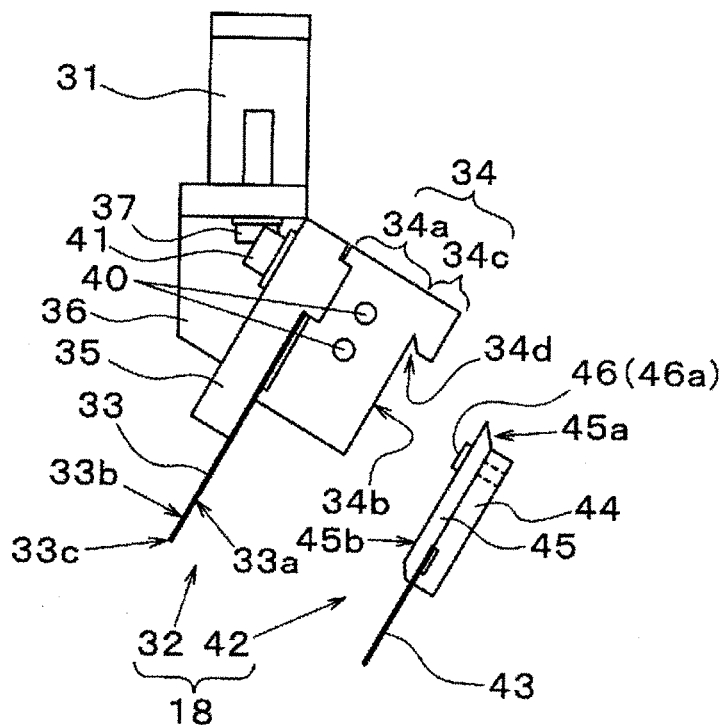
FIGS. 6A and 6B illustrate the structure of the one squeegee unit of the screen printing machine according to the embodiment of the invention.
Figure 6B:
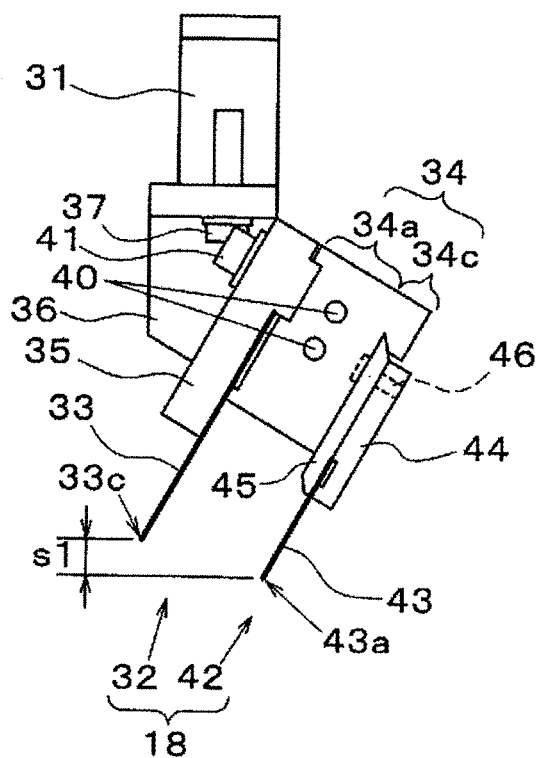

As shown in FIGS. 6A and 6B, the first member 34 includes a rectangular main body 34a which extends in the X direction and a block-shaped projection 34c which projects from a top portion of a side surface 34b, located on the downstream side in the squeegeeing direction, of the main body 34a. The bottom surface of the projection 34c is formed with a tapered cut 34d. As shown in FIG. 5A, plural (in the embodiment, six) magnets 38 (magnetic members) are buried in the first member 34 adjacent to the side surface 34b at prescribed positions and the side surface 34b is formed with plural (in the embodiment, four) bolt escape holes 39 for bolts 46 (described later). The projection 34c, the magnets 38, and the bolt escape holes 39 are used when the second squeegee unit 42 is attached to the first squeegee unit 32. Furthermore, magnets 40 for fixing a dam member 50 (described later) are buried in the first member 34 adjacent to each of side surfaces 34e which are located at the two respective ends of the first member 34 in its longitudinal direction.

The scraping squeegee 33 is a rectangular member extending in the X direction and is made of a flexible material such as urethane rubber. By inserting a top portion of the scraping squeegee 33 between the first member 34 and the second member 35 and fastening them to each other with bolts, as shown in FIGS. 6A and 6B the scraping squeegee 33 is held by the first member 34 and the second member 35 so as to be inclined (overhang) in the squeegeeing direction. Paste on the mask plate 15 is scraped off by sliding the bottom end 33c of the scraping squeegee 33 in a state that it is in contact with the top surface of the mask plate 15.

The first member 34 and the second member 35 function as a scraping squeegee holder for holding the scraping squeegee 33 and connects it to the squeegee elevation mechanism 19 via the attachment member 30 and the bracket 31. The second member 35 functions as a backup member which is in contact with a back surface 33b of the scraping squeegee 33 in the squeegeeing direction and thereby supports the scraping squeegee 33 from the back surface 33b side during a squeegeeing operation. In the embodiment, that surface of the scraping squeegee 33 which is located on the downstream side in the direction in which it advances during a squeegeeing operation is defined as a front surface 33a and its surface opposite to the front surface 33a is defined as the back surface 33b.

As shown in FIGS. 5A and 5B and FIGS. 6A and 6B, the second squeegee unit 42 has a third member 44 and a fourth member 45 which are shaped like rectangular plates and extend in the X direction which is perpendicular to the squeegeeing direction. The filling squeegee 43 is held by the third member 44 and the fourth member 45 by inserting a top portion of the filling squeegee 43 between them and fastening them to each other with plural (in the embodiment, four) bolts 46. The third member 44 and the fourth member 45 function as a filling squeegee holder for holding the filling squeegee 43. The third member 44 and the fourth member 45 are fastened to each other with the bolts 46 at positions corresponding to the respective positions of the bolt escape holes 39 formed in the first member 34.

The filling squeegee 43 is a thin, rectangular member extending in the X direction and is made of such a material as a metal or urethane rubber. In the embodiment, the filling squeegee 43 is made of stainless steel. Being flexible, the filling squeegee 43 is held by the filling squeegee holder in such a manner as to be allowed to bend with respect to the filling squeegee holder. The filling squeegee 43 is about 0.1 mm in thickness. The filling squeegee 43 has a function of filling the pattern holes 15a with paste P when it is moved relative to the mask plate 15 in the printing direction in a squeegeeing operation.

A top portion of the fourth member 45 has a tapered projection 45a which conforms, in shape, to the cut 34d of the first member 34. Magnets 47 (see FIG. 5A) are buried in the fourth member 45 adjacent to its side surface 45b which is located on the upstream side in the squeegeeing direction at positions corresponding to the respective positions of the magnets 38 which are buried in the first member 34.

To attach the second squeegee unit 42 to the first squeegee unit 32, the projection 45a of the fourth member 45 is inserted into the cut 34d of the first member 34 and the magnets 47 buried in the fourth member 45 are brought into contact with and the respective magnets 38 buried in the first member 34 so as to be connected to the latter by magnetic force. Furthermore, heads 46a of the bolts 46 (see FIG. 6A)

are inserted into the respective bolt escape holes 39. In this manner, the second squeegee unit 42 can be attached to the first squeegee unit 32 with the side surface 34*b* of the first member 34 and the side surface 45*b* of the fourth member 45 being in close contact with each other (see FIGS. 5B and 6B).

As shown in FIG. 6B, in a state that the second squeegee unit 42 is attached to the first squeegee unit 32, the filling squeegee 43 is held by the filling squeegee holder in such manners that it is inclined (overhang) in the squeegeeing direction and its bottom end 43*a* is lower than the bottom end 33*c* of the scraping squeegee 33 by a vertical distance sl. The scraping squeegee 33 and the filling squeegee 43 are held by the scraping squeegee holder and the filling squeegee holder, respectively, so as to be separated from each other by a prescribed distance in the squeegeeing direction with the filling squeegee 43 located downstream of the scraping squeegee 33 in the squeegeeing direction.

Figure 5B:
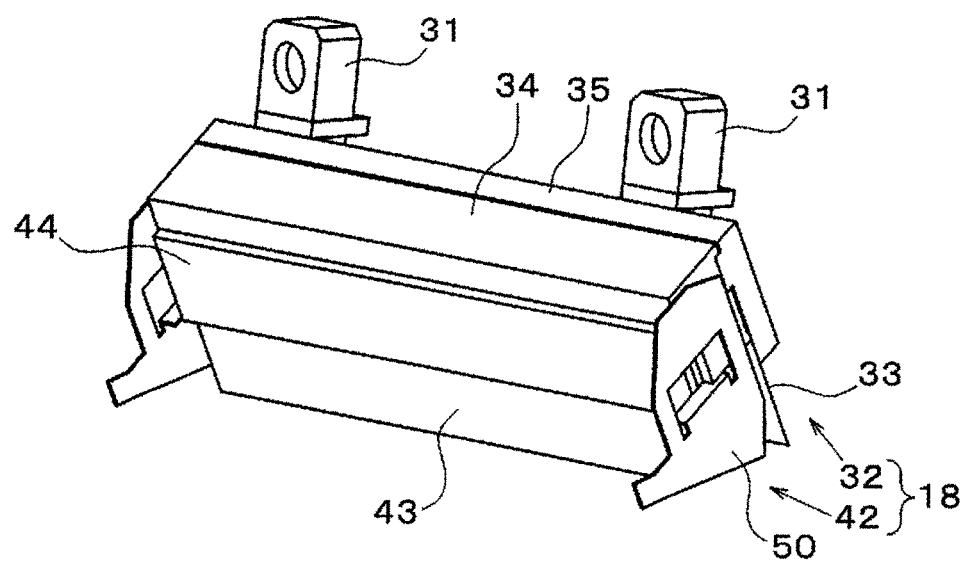
FIG. 5B is a perspective view of the squeegee unit shown in FIG. 5A.

As shown in FIGS. 5A and 5B, each dam member 50, which is mainly made of a magnetic, plate-like member, has an extension 50*a* which extends in the squeegeeing direction at the bottom. Each dam member 50 functions as a damming means for preventing a phenomenon that paste flows out of the mask plate 15 going around the side edge of the filling squeegee 43 during a squeegeeing operation. An approximately central portion of each dam member 50 is bent to form a bent portion 50*b* which projects in the thickness direction of the dam member 50.

To attach each dam member 50 to the first squeegee unit 32, the top surface of the bent portion 50*b* is brought into contact with the bottom surface of the first member 34 (main body 34*a*) and the one surface of the dam member 50 is brought into contact with the magnets 40 which are buried in the first member 34 adjacent to its side surface 34*e*. As a result, the dam member 50 can be fixed to the first squeegee unit 32 by magnetic force. In a state that the dam member 50 is fixed to the first squeegee unit 32, a bottom edge 50*c* of the dam member 50 and the bottom end 33*c* of the scraping squeegee 33 are approximately at the same height (also see FIGS. 7A and 7B).

The configuration of the screen printing machine M1 according to the embodiment has been described above. Next, a printing operation will be described with reference to FIGS. 7A and 7B, FIGS. 8A and 8B, and FIG. 9. For the sake of convenience, the dam members 50 are not shown in FIGS. 8A and 8B and FIG. 9. The following printing operation is performed as a control unit (not shown) of the screen printing machine M1 controls the individual drive mechanisms.

Figure 7A:
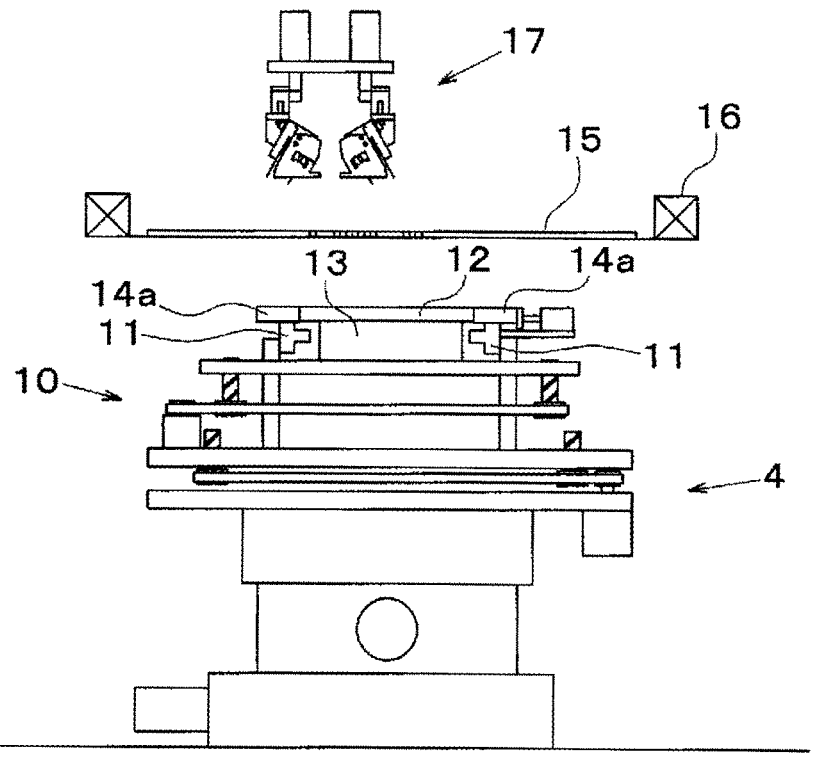
FIGS. 7A and 7B illustrate how a printing operation is performed by the screen printing machine according to the embodiment of the invention.

First, as soon as a board 12 is carried in to a prescribed printing position by the board conveying mechanism 11, as shown in FIG. 7A the control unit drives the second Z-axis table 10 to elevate the board receiving member 13 and has it receive the bottom surface of the board 12 from below. In this state, the control unit causes the clamp members 14*a* to press the board 12 from both sides and thereby fix it and drives the board positioning unit 4 to position the board 12 with respect to the mask plate 15.

Figure 7B:
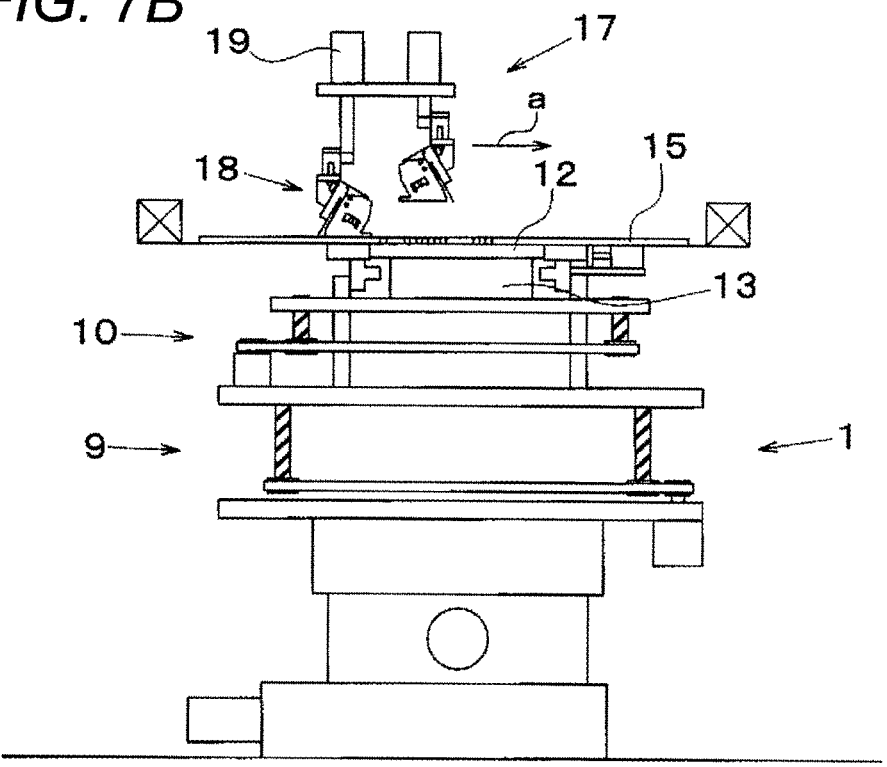
Figure 8A:
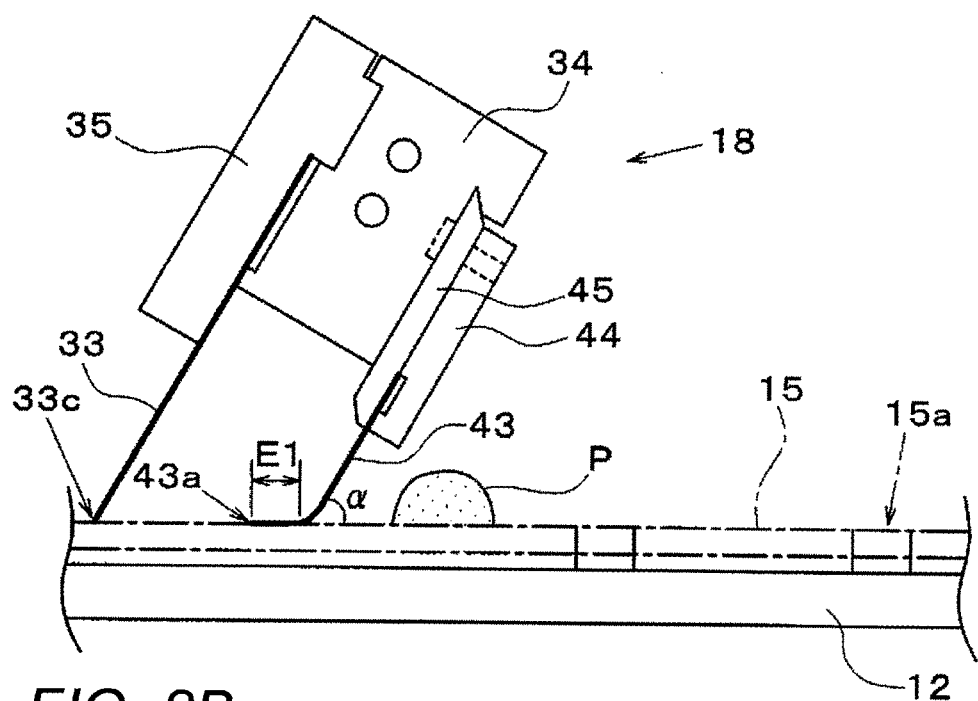
FIGS. 8A and 8B illustrate how a filling squeegee behaves in a squeegeeing operation in the embodiment of the invention.

Subsequently, as shown in FIG. 7B, the control unit drives the first Z-axis table 9 to elevate the board 12 together with the board receiving member 13 and bring the board 12 into contact with the bottom surface of the mask plate 15. In this state, the control unit causes one (the left one) of the two squeegee units 18 to lower from above one (the left one) of the two clamp members 14*a* and stop at such a position that the bottom end 33*c* of its scraping squeegee 33 comes into contact with the top surface of the mask plate 15. During this course, as shown in FIG. 8A, a portion of the filling squeegee 43 is bent on the mask plate 15 because the filling squeegee 43 continues to lower even after its bottom end 43*a* came into contact with the mask plate 15. As a result, a portion E1 including the bottom end 43*a* comes into surface contact with the mask plate 15.

After lowering the squeegee unit 18, the control unit causes a paste supply syringe (not shown) to supply paste P to the top surface of the mask plate 15. Then the control unit causes a squeegeeing operation in which the filling squeegee 43 and the scraping squeegee 33 slide in the printing direction (indicated by arrow "a" in FIG. 8B) on the mask plate 15 which has been supplied with the paste P. As a result, layers of paste P are formed on electrodes 12*a* of the board 12 through the pattern holes 15*a*.

How the filling squeegee 43 behaves in the squeegeeing operation will now be described with reference to FIG. 8B. As the filling squeegee 43 advances, paste P goes into the space between the filling squeegee 43 and the mask plate 15 and pushes up the filling squeegee 43. As a result, the filling squeegee 43 is bent upward more than in a state immediately before the start of the squeegeeing operation (see FIG. 8A). As the filling squeegee 43 advances further, its bottom end 43*a* is pushed up to a prescribed height by the paste P to establish a state that no portion of the filling squeegee 43 is in contact with the mask plate 15.

As a result, a clearance $\Delta h$ is formed between the bottom end 43*a* of the filling squeegee 43 and the mask plate 15 with the paste P interposed between them. In addition, a push interval (i.e., a range L1 from a bending start position t1 of the filling squeegee 43 and its bottom end 43*a*) is formed in which pushing force (filling pressure) of pushing the paste P downward is produced by resilient force F1 of the filling squeegee 43. As seen from the above description, the filling squeegee 43 should have such rigidity that during a squeegeeing operation it is bent upward by paste P and its bottom end 43*a* is pushed up relative to the top surface of the mask plate 15.

Figure 8B:
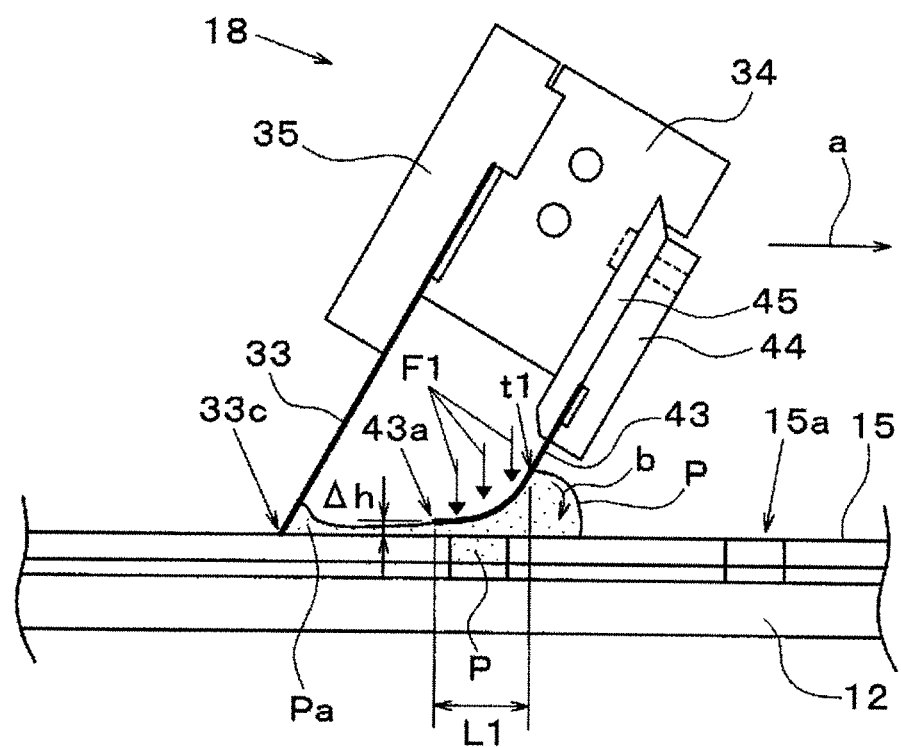

During the squeegeeing operation, as the filling squeegee 43 advances, paste P is pushed into the pattern holes 15*a* while receiving rolling action that renders it flowable in a rotation direction (indicated by arrow "b" in FIG. 8B). As described above, in the embodiment, a prescribed clearance $\Delta h$ is formed between the bottom end 43*a* of the filling squeegee 43 and the mask plate 15 with paste P interposed between them and a push interval having a prescribed length is formed over the mask plate 15 by causing the filling squeegee 43 to be bent by the paste P. With this measure, the paste filling time can be made longer and hence the ability to fill the pattern holes 15*a* with the paste P can be increased, unlike in a case shown in FIG. 8A in which the attack angle $\alpha$ formed by the mask plate 15 and the filling squeegee 43 is kept constant. Furthermore, a sufficient amount of paste P can be supplied to the board 12 even in the case of high-speed printing.

The reaction force that the filling squeegee 43 receives from the paste P varies irregularly depending on the amount of paste P, viscosity, printing speed, degree of bend of the mask plate 15, etc. The filling squeegee 43 advances while the clearance $\Delta h$ between the bottom end 43*a* of the filling squeegee 43 and the mask plate 15 varies depending on the magnitude of this reaction force. Therefore, even though the amount of paste P held by the filling squeegee 43 decreases gradually as a printing operation proceeds, the filling pressure in the push interval can be kept higher than a prescribed value and occurrence of unevenness in the amount of paste P applied from immediately after a start of the printing operation to its end can be avoided. Furthermore, a high filling pressure can be produced because the flow passage area of paste P is decreased gradually.

As described above, in the embodiment, a print of paste P is formed through the pattern holes 15a in a state that a prescribed filling pressure is produced because in a squeegeeing operation the filling squeegee 43 is bent being pushed up by the paste P and a prescribed clearance Δh is obtained between the bottom end 43a of the filling squeegee 43 and the mask plate 15 with the paste P interposed between them.

During a squeegeeing operation, a part (denoted by symbol Pa), not having been pushed into the pattern holes 15a by the filling squeegee 43, of the paste P flows out through the clearance Δh. This flow-out paste Pa is scraped off by the scraping squeegee 33. In this manner, the scraping squeegee 33 is held behind the filling squeegee 43 in the printing direction (indicated by arrow "a") so as to be separated from it by a prescribed interval and is moved in the printing direction together with the filling squeegee 43. Thus, the scraping squeegee 33 scrapes off the paste Pa remaining on the mask plate 15 after passage of the filling squeegee 43.

Figure 9:
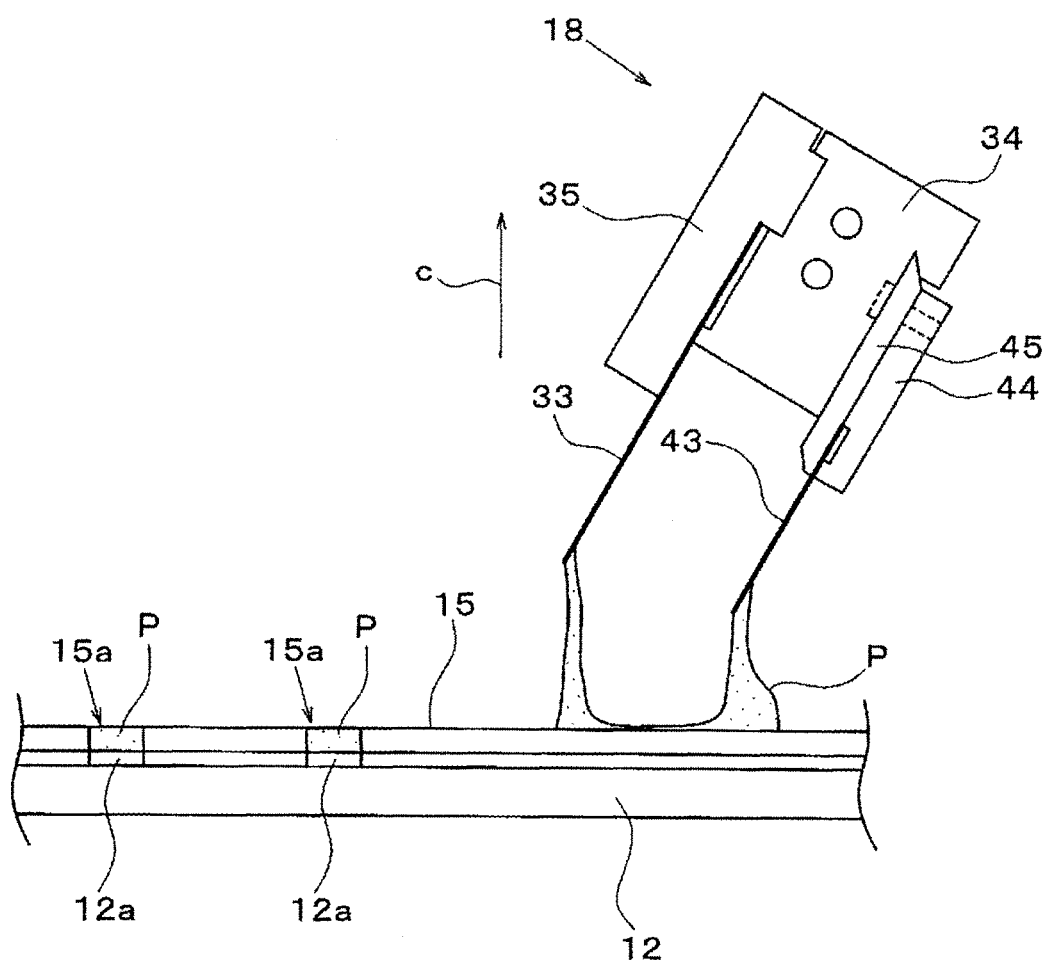
FIG. 9 illustrates how the filling squeegee behaves when it is elevated after a squeegeeing operation in the embodiment of the invention.

After moving the squeegee unit 18 to above the other clamp member 14a (i.e., the right one in FIG. 7A), as shown in FIG. 9 the control unit causes the squeegee units 18 to go up (indicated by arrow "c"). At this time, paste P that is stuck to the filling squeegee 43 and the scraping squeegee 33 is also elevated following them.

As the filling squeegee 43 is elevated, it recovers from the bent state to the ordinary, straight state (see FIG. 9), which is effective at dropping part of the paste P stuck to it and thereby reducing the amount of paste P that continues to stick to it. This suppresses the occurrence of an event that the paste P that is stuck to the filling squeegee 43 solidifies to adversely affect the next and following printing operations. Furthermore, this makes it possible to reduce the amount of supply of paste P to the mask plate 15 and thereby enables more economical printing operations.

As described above, in the screen printing machine M1 according to the embodiment, a print of paste P supplied to the mask plate 15 is formed on a board 12 in a state that the board 12 is in contact with the mask plate 15 having the pattern holes 15a. In a squeegeeing operation of this screen printing machine M1, the pattern holes 15a are filled with paste P with a prescribed filling pressure because the filling squeegee 43 is bent being pushed up by the paste P and a prescribed clearance Δh is obtained between the bottom end 43a of the filling squeegee 43 and the mask plate 15 with the paste P interposed between them. Since the ability of filling the pattern holes 15a with paste P is thus increased, unevenness of paste printing can be prevented and reduction of the printing performance can be avoided even in the case of high-speed printing.

Figure 10A:
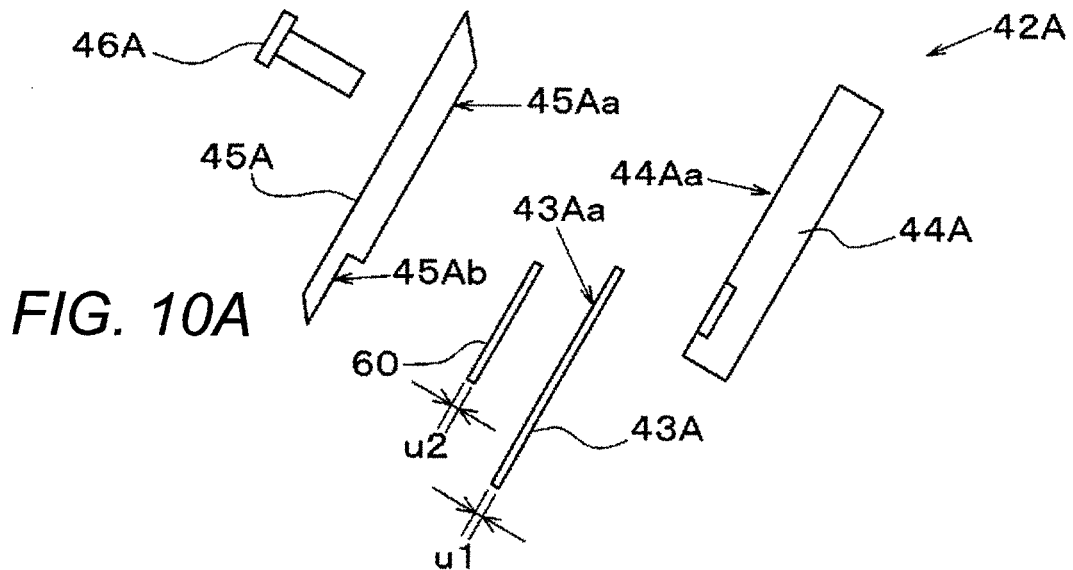
FIG. 10A (exploded view) and FIGS. 10B and 10C illustrate the structures of second squeegee units provided in a screen printing machine according to respective modifications of the embodiment of the invention.
Figure 10B:
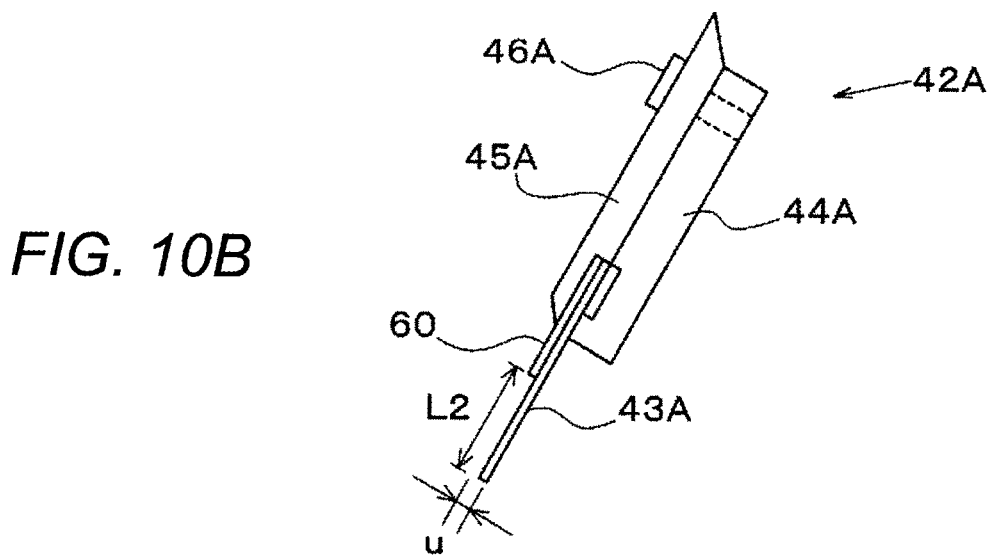

Next, modifications of the second squeegee unit 42 will be described with reference to FIGS. 10A-10C. A second squeegee unit 42A shown in FIGS. 10A and 10B is a modification that relates to the mode of attachment the scraping squeegee and the specific shape of the second squeegee unit. As shown in FIG. 10A, a fourth member 45A of the second squeegee unit 42A has a fastening surface 45Aa which is set so as to overhang in the advancement direction of a filling squeegee 43A and a holding surface 45Ab which is lower than the fastening surface 45Aa. In a state that a fastening surface 44Aa of a third member 44A is in contact with the fastening surface 45Aa, a prescribed gap "u" (see FIG. 10B) is formed between the holding surface 45Ab and the fastening surface 44Aa.

The filling squeegee 43A is a flexible, plate-like member and has a thickness u1 which is smaller than the gap "u." To have the filling squeegee 43A held by the third member 44A and the fourth member 45A, the filling squeegee 43A is inserted into the gap "u" and a backup member 60 whose thickness u2 satisfies a relationship u1+u2=u is brought into contact with a back surface 43Aa of the filling squeegee 43A. Then the third member 44A and the fourth member 45A are fastened to each other with bolts 46A (see FIG. 10B).

In this example, the rigidity of the filling squeegee 43A being held by a filling squeegee holder which is composed of the third member 44A and the fourth member 45A can be set suitable for printing conditions by setting, to a proper value, the length L2 of an extension portion, projecting relative to the backup member 60 without being backed up by it, of the filling squeegee 43A.

Figure 10C:
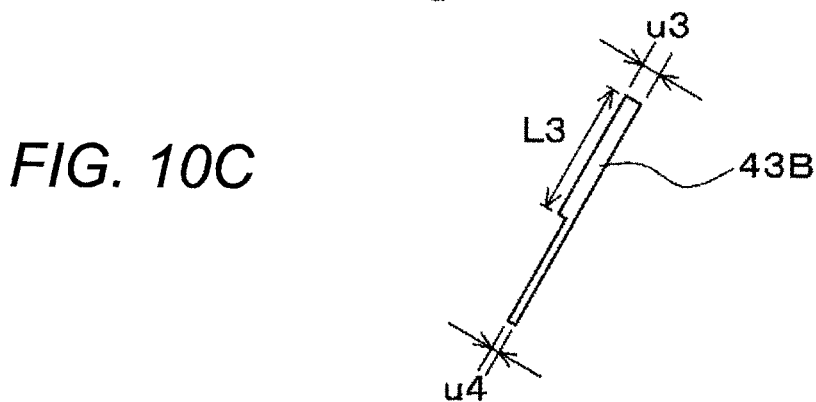

Alternatively, as shown in FIG. 10C, a filling squeegee 43B may be used which has portions that are different from each other in thickness. More specifically, the filling squeegee 43B is composed of a portion whose thickness u3 (=u) is equal to the sum of the respective thicknesses u1 and u2 of the above-described filling squeegee 43A and the backup member 60 and a portion whose thickness u4 is smaller than the thickness u3. The filling squeegee 43B is held by the filling squeegee holder by inserting the portion having the thickness u3 between the third member 44A and the fourth member 45A. In this example, the rigidity of the filling squeegee 43A can be set suitable for printing conditions by setting the length L3 of the portion having the thickness u3 to a proper value.

Figure 11A:
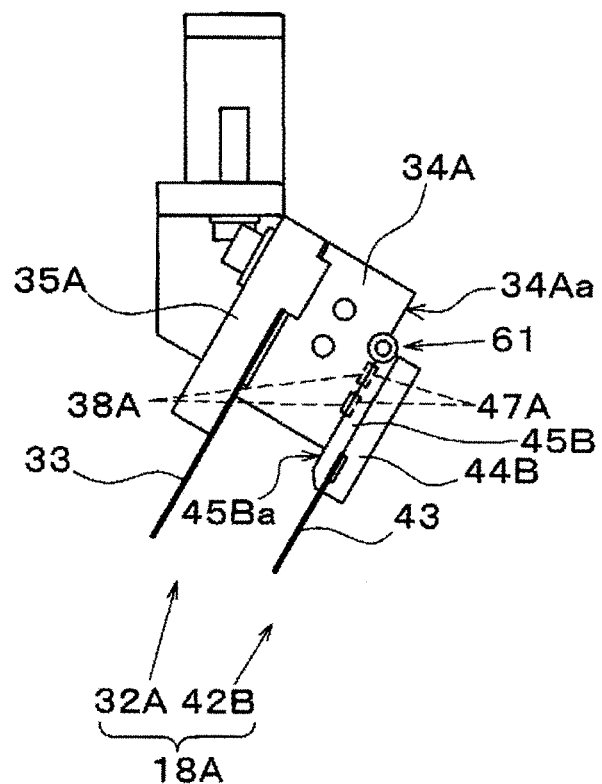
FIGS. 11A and 11B illustrate the structure of one squeegee unit provided in a screen printing machine according to another modification of the embodiment of the invention.
Figure 11B:
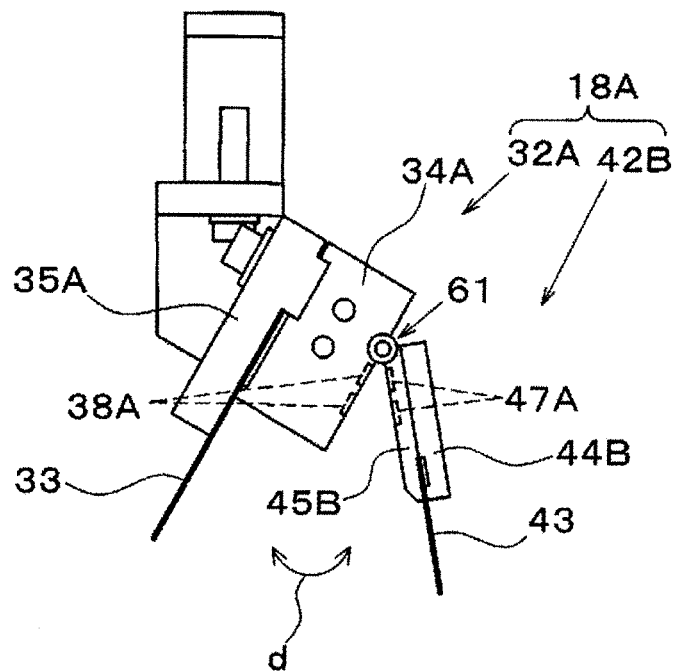

Next, a modification which relates to the mode of attachment of the second squeegee unit to the first squeegee unit will be described with reference to FIGS. 11A and 11B. FIGS. 11A and 11B show a squeegee unit 18A in which a second squeegee unit 42B is connected to a first squeegee unit 32A by a hinge. More specifically, a first member 34A of the first squeegee unit 32A is mainly formed by a member corresponding to the main body 34a of the first member 34 employed in the above-described embodiment and does not have a portion corresponding to the projection 34c of the first member 34. Magnets 38A are buried in the first member 34A adjacent to its side surface 34Aa. Magnets 47A are buried in a fourth member 45B of the second squeegee unit 42B adjacent to its side surface 45Ba which is opposed to the first member 34A, at positions corresponding to the respective positions of the magnets 38A. The fourth member 45B does not have a portion corresponding to the projection 45a employed in the above-described embodiment.

The fourth member 45B is connected to the first member 34A by a hinge mechanism 61 which has a rotary shaft (not shown) whose axis extends in the longitudinal direction (perpendicular to the paper surface of FIGS. 11A and 11B) of the first member 34A and the fourth member 45B. As shown in FIG. 11B, the second squeegee unit 42B is rotated (indicated by arrow "d") with respect to the first squeegee unit 32A about the rotary shaft of the hinge mechanism 61. The side surface 45Ba of the fourth member 45B is brought into close contact with the side surface 34Aa of the first member 34A by magnetic force produced by the magnets 38A and 47A (see FIG. 11A), whereby the second squeegee unit 42B is fixed to the first squeegee unit 32A.

A squeegeeing operation is performed in a state that the second squeegee unit 42B is connected to the first squeegee unit 32A (see FIG. 11A). To carry out maintenance work to, for example, replace the filling squeegee 43, the second squeegee unit 42B is rotated (indicated by arrow "d") by means of the hinge mechanism 61 and thereby released from the first squeegee unit 32A. As described above, in the embodiment of the invention, the second squeegee unit may be connected to the first squeegee unit by a hinge mechanism.

The invention is not limited to the above described embodiment and modifications and various changes are possible without departing from the spirit and scope of the invention. For example, the filling squeegee may be made of any material as long as its rigidity is such as to be described above. And there are no limitations on the material of the scraping squeegee. The structure for attaching (fixing) the second squeegee unit to the first squeegee unit is not limited to the ones described in the embodiment and the modifications and may be any of various structures. Furthermore, although the screen printing machines according to the embodiment and the modifications are equipped with the two squeegee units, the invention may be applied to only one of those squeegee units.

Capable of preventing unevenness of a paste print formed on a board and thereby preventing lowering of the print quality, aspects of the invention is particularly useful when applied to the field of electronic component mounting.

What is claimed is:

1. A screen printing method for forming, on a board, a print of paste supplied to a mask plate having pattern holes using a screen printing machine which comprises:
   a filling squeegee which extends from a base part at which the filling squeegee is held to a bottom end; and
   a scraping squeegee which extends from a base part at which the scraping squeegee is held to a bottom end, which is held to maintain a given interval from the filling squeegee in the printing direction and to be movable together with the filling squeegee in the printing direction, and which scraps off the paste remaining on the mask plate after passage of the filling squeegee,
   said screen printing method comprising:
   setting the mask plate and the board to contact each other;
   attaching the filling squeegee to the scraping squeegee to make the bottom end of the filling squeegee lower than the bottom end of the scraping squeegee in a vertical direction;
   lowering the filling squeegee and the scraping squeegee toward the mask plate such that a part of the filling squeegee comes in surface contact with an upper surface of the mask plate; and
   performing a squeegeeing operation in which the filling squeegee is moved relative to the mask plate in a printing direction to fill the pattern holes with the paste,
   wherein in the squeegeeing operation by the filling squeegee, the filling squeegee is pushed up by the paste, whereby a bending portion from the bottom end to a bending start part located closer to the bottom end than the base part is bent with respect to a portion from the base part to the bending start part, so as to provide a given clearance between the bottom end of the filling squeegee and the mask plate with the paste interposed therebetween such that the filling squeegee does not contact the mask plate and to form a push area in which force for pushing down the paste is generated by the portion from the bottom end to the bending start part so that the pattern holes are filled with paste with a given filling pressure, and
   wherein the squeegeeing operation continues in a state in which the filling squeegee is pushed up by the paste as the filling squeegee advances across the pattern holes, and
   wherein in the squeegeeing operation, the scraping squeegee moves in the printing direction together with the filling squeegee and scrapes a paste remaining on the mask plate after passage of the filling squeegee, and
   wherein a positional relationship between the filling squeegee and the scraping squeegee is unchanged during the squeegeeing operation except for the bending portion of the filling squeegee.

2. The screen printing method according to claim 1, wherein the filling squeegee is made of a material which makes the filling squeegee bendable to a degree that a clearance is formed between the bottom end of the filling squeegee and the upper surface of the mask plate and the bottom end of the filling squeegee is substantially in parallel to the upper surface of the mask plate.

3. The screen printing method according to claim 1, wherein a thickness of an upper end of the filling squeegee is larger than that of the bottom end of the filling squeegee.

4. The screen printing method according to claim 1, wherein the filling squeegee is attached to the scraping squeegee and the filling squeegee is held by a filling squeegee holder such that the filling squeegee is inclined in a squeegeeing direction and the bottom end of the filling squeegee is lower than the bottom end of the scraping squeegee by a vertical distance.

5. The screen printing method according to claim 1, wherein the scraping squeegee is held by a scraping squeegee holder and the filling squeegee is held by a filling squeegee holder, and the filling squeegee and the scraping squeegee are separated from each other by a prescribed distance in a squeegeeing direction with the filling squeegee being located downstream of the scraping squeegee in the squeegeeing direction.

6. The screen printing method according to claim 1, wherein the scraping squeegee and the filling squeegee are inclined in a squeegeeing direction to the same side relative to a vertical axis perpendicular to the printing direction.

7. The screen printing method according to claim 1, wherein the screen printing machine further comprises:
   a squeegee elevation mechanism that elevates or lowers a squeegee unit including the filling squeegee and the scraping squeegee, wherein the squeegee elevation mechanism elevates or lowers the filling squeegee and the scraping squeegee at the same time.

\* \* \* \* \*